United States Patent
Haque et al.

(10) Patent No.: US 7,710,781 B2
(45) Date of Patent: May 4, 2010

(54) DATA STORAGE AND PROCESSING ALGORITHM FOR PLACEMENT OF MULTI-LEVEL FLASH CELL (MLC) VT

(75) Inventors: Rezaul Haque, Folsom, CA (US);
Darshak A. Udeshi, Folsom, CA (US);
Karthi Ramamurthi, Folsom, CA (US);
Nathan C. Chrisman, Rescue, CA (US);
Aliasgar S. Madraswala, Folsom, CA (US); Kevin P. Flanagan, Rancho Cordova, CA (US)

(73) Assignee: Intel Corporation, Santa Clara, CA (US)

( * ) Notice: Subject to any disclaimer, the term of this patent is extended or adjusted under 35 U.S.C. 154(b) by 93 days.

(21) Appl. No.: 11/861,240

(22) Filed: Sep. 25, 2007

(65) Prior Publication Data

US 2009/0080248 A1 Mar. 26, 2009

(51) Int. Cl.
*G11C 16/06* (2006.01)
*G11C 16/04* (2006.01)

(52) U.S. Cl. .............. 365/185.21; 365/185.03; 365/185.22; 365/185.33

(58) Field of Classification Search ............. 365/185.21
See application file for complete search history.

(56) References Cited

U.S. PATENT DOCUMENTS

| | | | | |
|---|---|---|---|---|
| 5,894,436 A * | 4/1999 | Ohkawa et al. | ....... | 365/185.03 |
| 5,936,890 A * | 8/1999 | Yeom | ............ | 365/185.22 |
| 6,282,120 B1 * | 8/2001 | Cernea et al. | ........ | 365/185.21 |
| 6,288,935 B1 * | 9/2001 | Shibata et al. | ........ | 365/185.03 |
| 6,430,090 B1 * | 8/2002 | Homma | ............ | 365/189.15 |
| 6,487,122 B2 * | 11/2002 | Shibata et al. | ........ | 365/185.22 |
| 6,621,739 B2 * | 9/2003 | Gonzalez et al. | ...... | 365/185.21 |
| 6,807,096 B2 * | 10/2004 | Toda | .................... | 365/185.03 |
| 6,836,431 B2 * | 12/2004 | Chang | ............... | 365/185.03 |
| 6,865,112 B2 * | 3/2005 | Kawai et al. | ......... | 365/185.22 |
| 6,975,543 B2 * | 12/2005 | Kurihara | ............ | 365/185.22 |
| 7,031,192 B1 * | 4/2006 | Park et al. | .......... | 365/185.22 |
| 7,221,598 B2 * | 5/2007 | Jeong | ................. | 365/185.28 |

* cited by examiner

*Primary Examiner*—Son L Mai
(74) *Attorney, Agent, or Firm*—Kacvinsky LLC

(57) ABSTRACT

A wireless device that includes a memory device having an engine to execute a voting algorithm to average a memory cell data sensing result over time to provide a charge placement in the memory cell.

17 Claims, 2 Drawing Sheets

DATA STORAGE AND PROCESSING ALGORITHM FOR PLACEMENT OF MULTI-LEVEL FLASH CELL (MLC) VT

Technological developments permit digitization and compression of large amounts of voice, video, imaging, and data information, which may be stored in memory, then wirelessly transmitted between laptops, cameras and a host of other digital electronic equipment. With the amounts of data that devices store, enhancements to memory devices that promote greater storage capabilities to handle the higher data volumes are needed. One notable issue that needs resolution as data storage capabilities expand and memory technologies scale is the placement of stored charge in multi-level flash cells.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
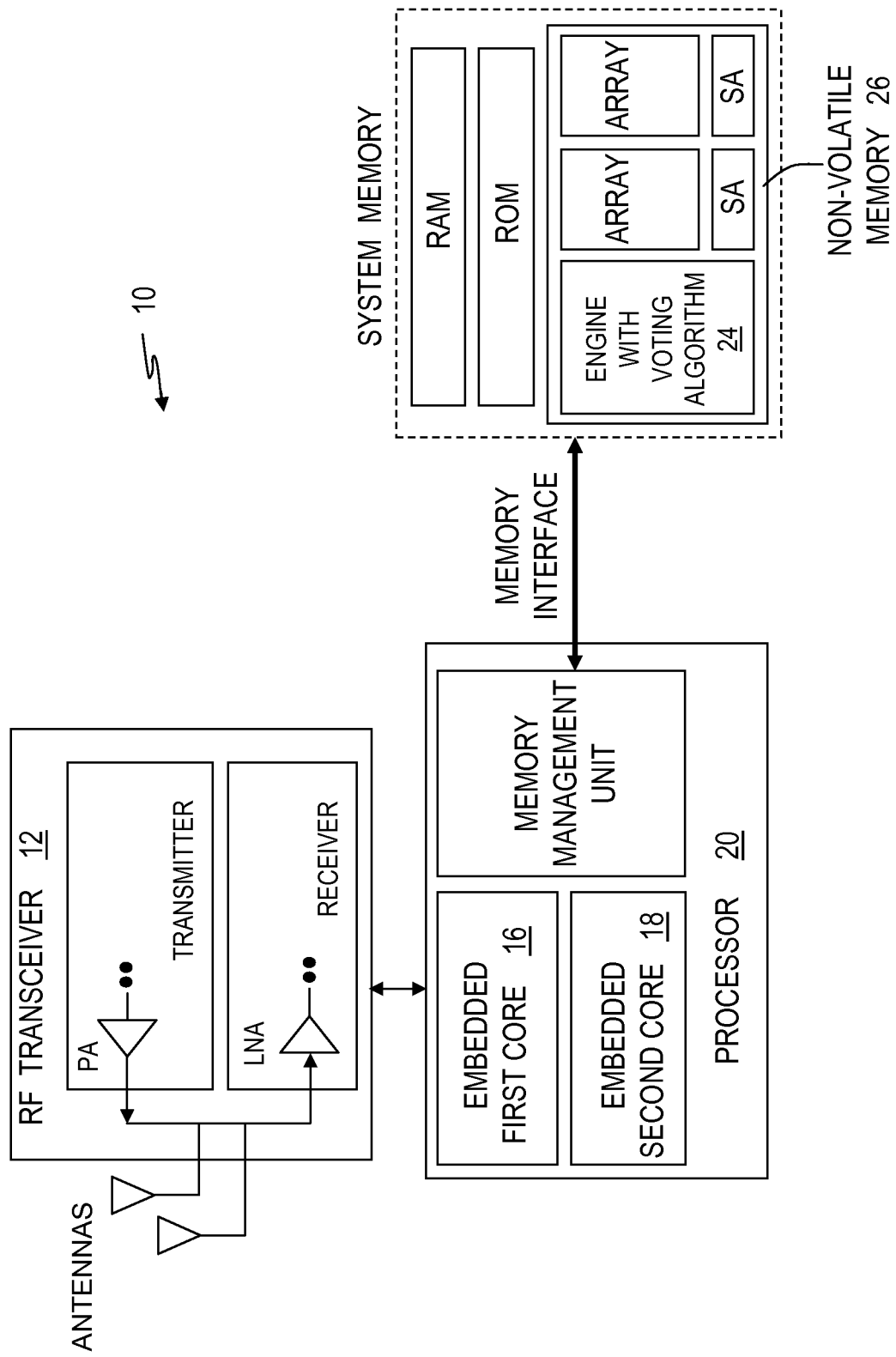
FIG. 1 is a diagram that illustrates a processor interfaced with a non-volatile memory device that utilizes an engine to execute a triple verify voting scheme.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

FIG. 1 is a simplistic embodiment of a multi-core processor that executes algorithms, then stores data in system memory in non-volatile memory devices. The embodiment presented in the figure illustrates a wireless device 10 having antenna(s) coupled to transceivers 12 to accommodate modulation/demodulation. The embodiment allows for multiple radio subsystems collocated in the same platform of communications device 10 to provide the capability of communicating in an RF/location space with other devices. The analog front end transceiver 12 is connected to a multi-core processor 20. Embedded processor cores 16 and 18 may execute baseband and process application functions and allow processing workloads to be shared across the embedded processor cores.

The present invention may be used in a non-volatile memory device 26 operating with a multi-core processor, or alternatively, memory device 26 may store information used by a single core processor as well. The scaling of non-volatile memory devices bundled within the system memory accentuates the effects of Random Telegraphic Signal (RTS) noise as measured in the non-volatile cell I-V characteristics. RTS is an intrinsic cell characteristic attributable to the imperfections in the gate oxide of the transistors found in the memory cell. As a result of the imperfections and scaling, random variations may be seen in the memory cell currents even when a constant voltage is applied to the gate and a constant drain-to-source voltage is supplied to the memory cell. Put another way, the flash cell current exhibits pronounced time-varying random noise that may lead to sensing failures in the Multi-Level Cells (MLCs).

However, in accordance with features of the present invention the effects of RTS may be tolerated in the read operation used to validate the placement of the stored charge on the gate after programming through the use of a voting scheme. In one embodiment, an engine 24 may execute a triple verify voting scheme. Even though a significant portion of the Read Window Budget (RWB) is taken by RTS noise and the noise component may result in unintended values being sensed for the stored data, the verify algorithm may be used to achieve higher probabilities of correctly providing verified stored cell data.

Figure 2:
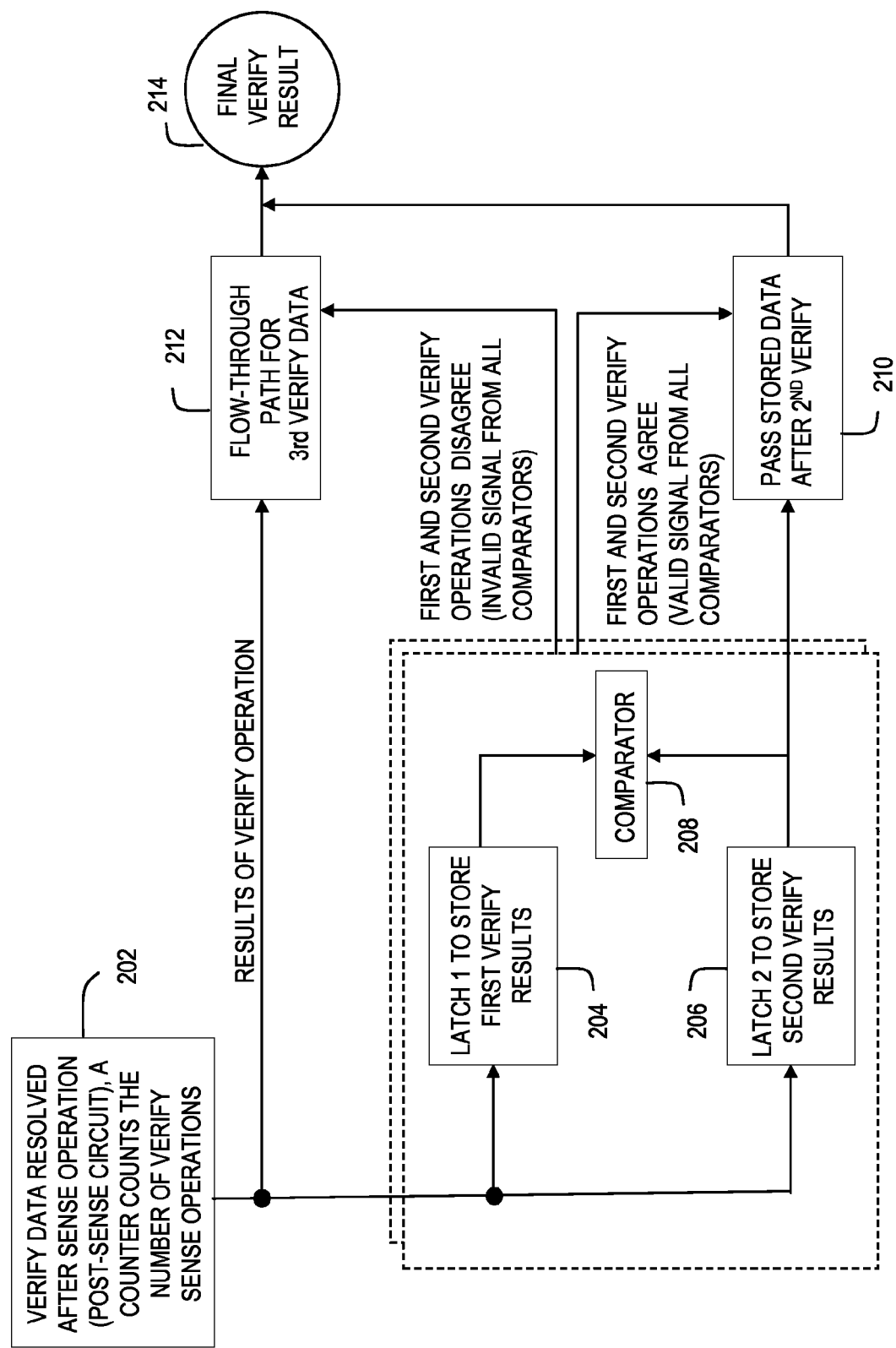
FIG. 2 is a diagram that illustrates the use of multiple verify cycles to check the $V_t$ of a programmed cell in accordance with the voting scheme.

Whereas prior art Flash memory technologies use one verify cycle to place the threshold voltage ($V_t$) of a cell while programming data, the embodiment shown in FIG. 2 illustrates the verify algorithm in accordance with the present invention. Note that a verify cycle involves a program pulse followed by a sense cycle to check if the $V_t$ of the programmed cell is at the desired program level. Due to the effects of RTS, a single verify cycle may sense a higher or a lower current at the specified voltage condition and the algorithm may resolve that the cell programming is placed as intended, while in reality the actual memory cell $V_t$ may not be at the desired program level. To overcome this problem caused by RTS, the verify algorithm of the present invention includes three separate serial sense cycles consecutively performed on the same memory cell.

FIG. 2 is a block diagram that illustrates features of the verify algorithm that is executed by engine 24 (see FIG. 1) within non-volatile memory 26. A program cycle is followed by three verify cycles. Block 202 indicates that the data resulting from the first verify cycle is resolved after a sense operation (post-sense circuit) and that a counter tracks the number of the verify sense operation. Block 204 indicates that the data output from the sense amps from the first verify cycle is stored in a LATCH 1. According to the verify algorithm, a second verify cycle checks whether the $V_t$ of the same programmed cell is at the desired program level. Block 206 indicates that the data output from the sense amps from the second verify cycle is stored in a LATCH 2.

By comparing the data stored in LATCH 1 with the data stored in LATCH 2, a comparator 208 determines whether the stored results of the first and second verify agree as to the programming status of the memory cell. If comparator 208 indicates that the first and second verify agree as indicated by the same output data stored in LATCH 1 and LATCH 2, then that stored data is transferred to the next stage as indicated by block 210. For the case when the first and second verify provide results stored in LATCH 1 and LATCH 2 that agree, then a third verify cycle is not run and the results of the second verify cycle are passed to provide the final verify result (see block 214).

However, if comparator 208 indicates that the first and second verify disagree as indicated by the different outputs for the data stored in LATCH 1 and LATCH 2, then the stored data in neither LATCH 1 nor LATCH 2 is transferred to the next stage (see block 212). Instead, a third verify checks whether the $V_t$ of a programmed cell is at the desired program level. The results of the third verify cycle flow through to provide the final verify result (see block 214).

The described verify algorithm implements voting criteria to adopt the "best of three" as the final result, although more than three verifies may be used. Best of three includes the result voted by the majority of the sense outputs regarding the cell placement. In other words, if the first verify maintains that the cell Vt is programmed at the appropriate level and the rest of the three verifies disagree with the first verify, then the best of three verify scheme uses the voting mechanism to resolve the memory cell data and conclude that the cell requires further programming pulses. This ensures that even if RTS noise leads to an incorrect sense, the other two verifies can correctly lead to the correct programming and to the correct results. Obviously this voting criteria creates an additional overhead of two extra sense cycles, but note that the sense cycle is a small part of the entire program algorithm. Note that most of the program algorithm is taken up by pulsing the memory cells to produce the programming. This voting scheme lessens the effect of any RTS noise on cell placement and has minimal impact on programming speed.

The verify algorithm has been described for one sensed bit for simplicity, however, all sensed outputs of MLC cells are resolved using the verify algorithm. By way of example, in one embodiment for a 45 nm technology the MLC product produces 272 bits of data from the flash array. Thus, 272 units that include the two latches (LATCH 1 and LATCH 2) and a comparator for each unit are used to verify data processing within the chip. If the comparators in all those 272 units agree that the data stored in LATCH 1 from the first verify cycle matches the data stored in LATCH 2 from the second verify cycle, then a universal VALID signal is asserted to inform a main PROGRAM algorithm that the third verify cycle is not required and that the current data is valid. On the other hand, if the verify results stored in LATCH 1 and LATCH 2 for the same Flash cell are different as indicated by any one of 272 comparators, then the VALID signal remains low and a third verify is performed. Once the third verify cycle is initiated, the verify algorithm accepts the result of the third cycle as valid data irrespective of the first two verify data outputs and processes that data.

By now it should be apparent that embodiments of the present invention allow increased program reliability through use of the described verify algorithm that uses a voting scheme to program and verify memory data. Scaled flash memory devices have become susceptible to the dominant noise component based on the RTS effects, and the present invention using the triple verify scheme negates RTS effects by averaging the memory cell data sensing result over time to facilitate a robust $V_t$ placement scheme.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. A memory device, comprising:
    an engine to execute a verify algorithm that generates a program pulse followed by a first, second, and third sense cycle to provide a first, second and third data output of the program status of a memory cell;
    a first latch to store the first data output from sense amps in the first sense cycle; and
    a second latch to store the second data output from sense amps provided in the second sense cycle.

2. The memory device of claim 1 wherein the program pulse and the first sense cycle check a $V_t$ of a programmed cell.

3. The memory device of claim 2 wherein the program pulse and the second sense cycle check the $V_t$ of the programmed cell.

4. The memory device of claim 1 further including a comparator to compare the first data output stored in the first latch against the second data output stored in the second latch.

5. The memory device of claim 4 wherein the stored results of the second latch are transferred to program the memory cell when the programming status of the first latch and the second latch are in agreement.

6. The memory device of claim 4 wherein the program pulse and the third sense cycle check whether the $V_t$ of the programmed cell is at the desired program level.

7. The memory device of claim 4 wherein the results of the third verify cycle provide a final verify result when the first data output stored in the first latch does not match the second data output stored in the second latch as determined by the comparator.

8. A Flash memory device, comprising:
    an engine to execute a verify algorithm;
    a first latch to store a first data sensed by sense amps for a memory cell in a first cycle; and
    a second latch to store a second data sensed by the sense amps for the memory cell in a second cycle, wherein the verify algorithm uses the second data as a charge placement for a memory cell when the first data matches the second data.

9. The Flash memory device of claim 8 wherein the first cycle includes a first sense of the sense amps preceded by a program pulse.

10. The Flash memory device of claim 8 wherein the second cycle includes a second sense of the sense amps preceded by the first sense in the first cycle.

11. The Flash memory device of claim 8 further including a comparator to compare the first data stored in the first latch with the second data stored in the second latch.

12. The Flash memory device of claim 11 wherein the verify algorithm executes a third cycle that includes a third sense of the sense amps preceded by the second sense to generate third data as a charge placement for the memory cell when the first data does not match the second data.

13. A wireless device, comprising:
    first and second antenna;
    a transceiver coupled to the first and second antenna;
    a multi-core processor to receive a demodulated signal from the transceiver; and
    a non-volatile memory coupled to the multi-core processor to store data that includes an engine to execute a verify algorithm to determine a charge placement in a memory cell by storing in a first latch results of sensing first data following a program pulse and storing in a second latch results of sensing second data following a program pulse.

14. The wireless device of claim 13 wherein the verify algorithm uses data stored in the second latch as the charge placement for the memory cell when the data stored in the first latch matches the data stored in the second latch.

15. The wireless device of claim 14 wherein the verify algorithm runs a third cycle of a program pulse followed by a sense cycle when the data stored in the first latch does not match the data stored in the second latch, wherein sensed results of the third cycle determine the charge placement for the memory cell.

16. A method to dynamically adapt a placement charge by a non-volatile memory device, comprising:
    providing a program pulse to a memory cell followed by a first sense cycle that provides a first latched result;
    providing a second sense cycle that provides a second latched result; and
    comparing the first result to the second result where a match provides the second latched result to program a charge placement in the memory cell.

17. The method of claim 16 further including:
    comparing the first result to the second result where a non-match results in a third sense cycle that provides a result used to program a charge placement in the memory cell.

* * * * *